United States Patent [19]

Tsang

[11] Patent Number: 4,602,370
[45] Date of Patent: Jul. 22, 1986

[54] LARGE OPTICAL CAVITY LASER HAVING A PLURALITY OF ACTIVE LAYERS

[75] Inventor: Won-Tien Tsang, New Providence, N.J.

[73] Assignee: AT&T Bell Laboratories, Murray Hill, N.J.

[21] Appl. No.: 493,792

[22] Filed: May 12, 1983

[51] Int. Cl.$^4$ ............................................. H01S 3/19
[52] U.S. Cl. ...................................... 372/45; 357/16; 357/17
[58] Field of Search ...................... 372/44, 45; 357/16, 357/17

[56] References Cited

U.S. PATENT DOCUMENTS 4,163,238  7/1979  Esaki et al. ............................ 357/17

OTHER PUBLICATIONS

Tsang et al, "Current Injection GaAs-Al$_x$Ga$_{1-x}$ As Multi-Quantum-Well Heterostructure Lasers Prepared by Molecular Beam Epitaxy", Appl. Phys. Lett. 35(9), Nov. 1, 1979, pp. 673-675.
H. F. Lockwood et al, "An Efficient Large Optical Cavity Injection Laser", Applied Physics Letters, vol. 17, No. 11, Dec. 1, 1970, pp. 499-502.
J. P. van der Ziel et al, "Integrated Multilayer GaAs Lasers Separated by Tunnel Junctions", Applied Physics Letters, vol. 41, No. 6, Sep. 15, 1982, pp. 499-501.

Primary Examiner—James W. Davie
Attorney, Agent, or Firm—Richard D. Laumann

[57] ABSTRACT

A large optical cavity injection laser having a plurality of active layers within the large optical cavity. The active layers having a thickness great enough so that quantum effects are not significant.

10 Claims, 2 Drawing Figures ated to 20 radiation. However, this solution is not feasible for
LARGE OPTICAL CAVITY LASER HAVING A PLURALITY OF ACTIVE LAYERS

TECHNICAL FIELD

This invention relates generally to semiconductor lasers and particularly to such lasers having a plurality of active layers within a large optical cavity.

BACKGROUND OF THE INVENTION

For many commercial applications, semiconductor lasers capable of emitting radiation at relatively high power intensities, that is, more than several watts, are desired. Such lasers would be useful in applications such as light sources for long distance optical communications systems and optical recording systems. It might be naively thought that the power output from a semiconductor injection laser could be easily increased by increasing the current through the laser and thereby increasing the electron-hole recombination that leads to radiation. However, this solution is not feasible for more than a relatively limited current regime because the maximum power output obtainable from a single semiconductor laser is limited by the observed fact that catastrophic damage occurs to the cleaved mirror surfaces forming the optical cavity of the laser when the optical density exceeds a threshold value. The threshold for catastrophic damage varies from laser to laser but is typically between 3 and 5 MW/cm$^2$. Accordingly, efforts have been directed toward devising semiconductor laser structures capable of emitting still higher power output.

One such effort has been termed the "large optical cavity laser" by those working in the art and is described in, for example, *Applied Physics Letters*, 17, pp. 499–502, Dec. 1, 1970. In the structure described, the recombination or active region, that is, the region in which electrons and holes recombine to yield radiation, is much smaller than the region in which the optical energy is confined, hence the name "large optical cavity." The large optical cavity permits higher radiation power to be emitted without catastrophic damage to the mirror surfaces as the radiation is emitted from the relatively large end surfaces of the large optical cavity. However, the large optical cavity lasers do not always utilize carriers with great efficiency as a significant number of carriers leave the active region and therefore do not contribute to the emitted radiation. Accordingly, effort was also directed toward optimizing, with respect to carrier utilization, placement of the active layer within the large optical cavity.

Another effort formed a device having a plurality of single heterostructure lasers comprising, for example, GaAs/Al$_x$Ga$_{1-x}$As, and solders them together. An improved version of this effort is described in *Applied Physics Letters*, 41, pp. 499–501, Sept. 15, 1982. In this embodiment, reversed biased p$^+$-n$^+$ crystal tunnel junctions replace the solder joints.

However, the approaches taken by the latter two mentioned efforts suffer from several drawbacks. For example, the light-emitting, i.e., active, layers have to be relatively far apart to avoid material absorption by either the metallic joints or the tunnel junctions. This relatively large spacing means that the optical outputs from the individual lasers are not coupled to each other and are therefore incoherent and do not have the same spectral property. Additionally, if the device comprising the plurality of lasers is to have linear light output versus current characteristics, all of the lasers have to be essentially identical and must begin to lase simultaneously. This is an exceedingly stringent requirement that is often difficult to realize in practice.

SUMMARY OF THE INVENTION

A semiconductor laser comprising a large optical cavity further comprising a plurality of active layers having a first bandgap interleaved with a plurality of spacer layers having a second bandgap has relatively high power output capabilities. The first bandgap is less than the second bandgap. The total thickness of the large optical cavity is smaller than the diffusion lengths of the carriers. This is approximately 3 $\mu$m in Al$_x$Ga$_{1-x}$As. The lasers further comprise first and second cladding layers having first and second conductivity types, respectively, and which are disposed on opposite sides of the large optical cavity. The cladding layers have a dielectric constant that is smaller than the dielectric constants of the large optical cavity layers to provide optical confinement. The lasers are fabricated from, for example, Group III-V compound semiconductors.

DETAILED DESCRIPTION

Figure 1:
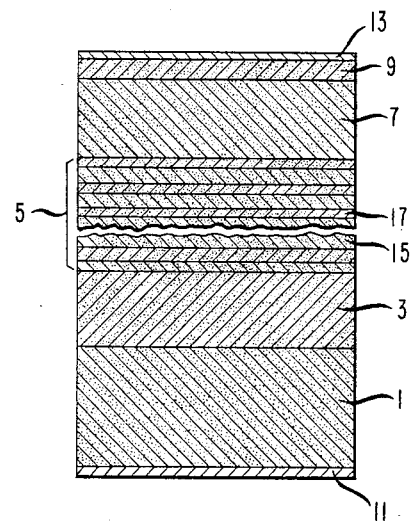
FIG. 1 is a sectional view of a large optical cavity laser having a plurality of active layers according to this invention.

An embodiment of the large optical cavity laser having a plurality of active layers according to this invention is depicted in sectional view in FIG. 1. For reasons of clarity, the elements of the device are not drawn to scale.

The device comprises substrate 1, first cladding layer 3, large optical cavity 5, second cladding layer 7, and contact layer 9. Substrate 1 and contact layer 9 are electrically contacted by ohmic contacts 11 and 13, respectively, and are both highly doped to facilitate formation of good electrical contacts. The substrate and first cladding layer have a first conductivity type and the second cladding layer and contact layer have a second conductivity type.

The large optical cavity comprises a plurality of active layers 15 and a plurality of spacer layers 17. The active layers 15 and spacer layers 17 are interleaved with each other; that is, the sequence of layers within the large optical cavity is active, spacer, active, etc. The precise number of active layers and spacer layers is not critical. The cladding layers have a dielectric constant less than those of the large optical cavity to provide confinement of the optical field. The layers within the large optical cavity are nominally undoped to facilitate carrier diffusion. The active layers have a first bandgap and the spacer layers have a second bandgap. The first bandgap is smaller than the second bandgap. The difference in the bandgaps of the active and spacer layers is desirably small enough to permit carriers to move by thermionic emission from one active layer to another active layer. The active layers have a thickness great enough so that quantum effects are not significant. The spacer layers have a thickness desirably greater than the carrier tunneling distance and less than the carrier diffusion length.

In one embodiment, the first conductivity type is n-type and the second conductivity type is p-type. The layers of the device comprise, for example, Group III–V compound semiconductors such as $Al_xGa_{1-x}As$ or InGaAsP and which may be either binary, ternary, or quaternary. The lasers may be grown by any of the conventional and well-known techniques for growing epitaxial layers. However, the interleaving of the comparatively thin active and spacer layers makes the selection of techniques, such as molecular beam epitaxy, that are well-suited to fabrication of such structures, desirable. The layers are at least approximately lattice matched to each other.

The large optical cavity layers are nominally undoped in order to increase the diffusion lengths of the carriers within the large optical cavity. The total thickness of the large optical cavity should be less than the diffusion lengths of the carriers. There is essentially uniform carrier injection into the several active layers because the difference in bandgaps between the active and spacer layers is small enough so that the carriers can move from active layer to active layer by thermionic emission. For active layers comprising $Al_xGa_{1-x}As$ and spacer layers comprising $Al_yGa_{1-y}As$, y should be less than approximately $0.2+x$. The thicknesses of the active layers and the thicknesses of the spacer layers are selected so that the active layers are tightly optically coupled to each other, i.e., the optical field extends between the two cladding layers over the entire large optical cavity. The result is that the entire large optical cavity comprising the plurality of active layers and spacer layers forms a single waveguide.

Two illustrative embodiments will be described for purposes of illustration. The cladding layers for both embodiments comprised $Al_{0.5}Ga_{0.5}As$ and the contact layer and the substrate comprised GaAs. The first conductivity type was n-type and the second conductivity type was p-type. In one embodiment, there were four GaAs active layers having a thickness of 700 Angstroms each and which were separated by 3200 Angstrom thick spacer layers comprising $Al_{0.1}Ga_{0.9}As$. The total large optical cavity thickness was 1.24 $\mu$m. The second embodiment comprised six GaAs active layers having a thickness of 900 Angstroms each and spacer layers which were 3400 Angstroms thick and which comprised $Al_{0.1}Ga_{0.9}As$. The resulting total large optical cavity thickness was 2.24 $\mu$m. The epitaxial layers were grown by molecular beam epitaxy. The ohmic contacts were formed by well-known and conventional techniques. Standard cleaving procedures were used to form diodes which were 400 $\mu$m long and 250 $\mu$m wide with saw-cut sidewalls. The diodes were bonded p-type side down with indium on copper heat sinks.

Figure 2:
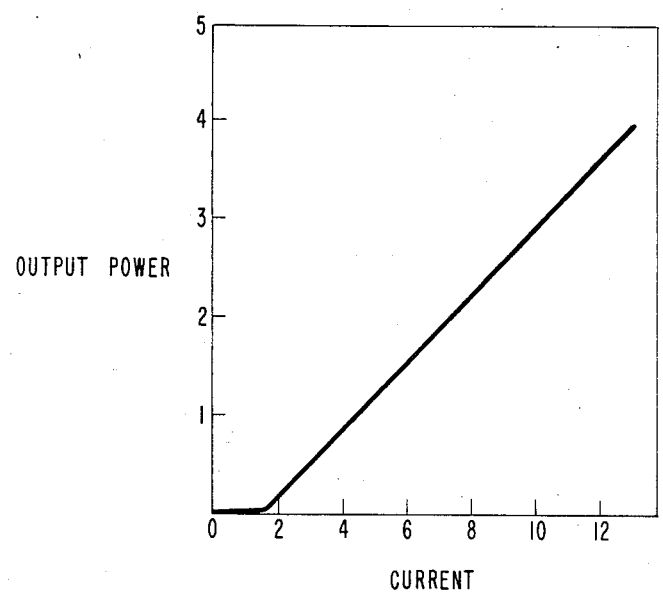
FIG. 2 plots the output power vertically in units of watts versus the current horizontally in units of amps.

FIG. 2 plots the peak of output power vertically in units of watts versus the current horizontally in units of amps for a laser according to this invention having four GaAs active layers. The current was pulsed with pulse durations of 500 ns at 1 KHz. As can be seen, a very linear light output versus current curve is obtained even for power outputs as high as 4 watts/mirror without exhibiting saturation behavior. It should also be noted that lasing turn-on occurs extremely abruptly thereby indicating that all of the individual active layers begin to lase simultaneously.

Although there may be internal circulating modes in these broad area diodes, the external differential quantum efficiency was measured to be approximately 60 percent which is relatively high. The efficiency is believed to be high because of efficient carrier utilization by the plurality of active layers. The threshold current densities were approximately 4.3 $KA/cm^2$ which is relatively low. The combination of the high external differential quantum efficiency and the low threshold current density indicates that the carriers injected into the large optical cavity are efficiently utilized by the active layers to recombine and generate photons. It should be noted that if all of the plurality of active layers were combined to form a single active layer of equivalent total thickness, the carriers would leak out of the active layer into the waveguide and would not be further utilized. The result would be an extremely high current threshold. However, when carriers leave the first active layer within the large optical cavity, they may be further collected and utilized by subsequent active layers. Additionally, there may be mutual photopumping of the active layers.

The temperature dependence of the pulsed threshold was measured and a high temperature coefficient, $T_0$, of 175K was measured for temperatures below approximately 80 degrees C. This value is similar to the values obtained for regular double heterostructure lasers for separate confinement heterostructure lasers that also have good injected carrier confinement. This is a further indication that although the large optical cavity is thick, the injected carriers are utilized effectively by the plurality of active layers in generating radiation.

Modifications of the embodiments described will be readily thought of by those skilled in the art. For example, the compositions and thicknesses of the spacer layers need not be identical and the compositions and thicknesses of the active layers need not be identical.

What is claimed is:

1. A semiconductor laser comprising a first cladding layer having a first conductivity type, a second cladding layer having a second conductivity type, and a large optical cavity, said large optical cavity being between said first cladding layer and said second cladding layer, said large optical cavity comprising a plurality of active layers having a first bandgap interleaved with a plurality of spacer layers having a second bandgap, said first bandgap being less than said second bandgap, said active layers having a thickness great enough so that quantum effects are not significant.

2. A semiconductor laser as recited in claim 1 in which said spacer layers have a thickness smaller than the carrier diffusion length.

3. A laser as recited in claim 2 in which said large optical cavity has a thickness smaller than the carrier diffusion length.

4. A laser as recited in claim 3 in which said spacer layers have a thickness greater than the carrier tunneling distance.

5. A laser as recited in claim 4 in which the difference in said first and second bandgaps permits carriers to move by thermionic emission between active layers in said large optical cavity.

6. A laser as recited in claim 5 in which said layers comprise materials selected from the group consisting of Group III–V and Group III–VI compound semiconductors.

7. A laser as recited in claim 6 in which said materials are selected from the group consisting of Group III–V compound semiconductors.

8. A laser as recited in claim 7 in which said Group III–V compound semiconductors are selected from the group consisting of AlGaAs, InGaAsP and GaAlInAs.

9. A laser as recited in claim 8 in which said active layers comprise $Al_xGa_{1-x}As$, and said spacer layers comprise $Al_yGa_{1-y}As$.

10. A laser as recited in claim 9 in which y is less than approximately $0.2+x$.

* * * * *

UNITED STATES PATENT AND TRADEMARK OFFICE
CERTIFICATE OF CORRECTION

PATENT NO. : 4,602,370

DATED : July 22, 1986

INVENTOR(S) : Won-Tien (No Middle Name) Tsang

It is certified that error appears in the above-identified patent and that said Letters Patent is hereby corrected as shown below:

Column 4, Line 56, "III-VI" should read --II-VI--.

Signed and Sealed this

Twenty-eighth Day of October, 1986

[SEAL]

Attest:

DONALD J. QUIGG

Attesting Officer     Commissioner of Patents and Trademarks